United States Patent [19]
Kobayashi

[11] Patent Number: 5,943,292
[45] Date of Patent: Aug. 24, 1999

[54] ADDRESS COUNTER CIRCUIT AND SEMICONDUCTOR MEMORY DEVICE

[75] Inventor: Tomohiro Kobayashi, Yokohama, Japan

[73] Assignee: Kabushiki Kaisha Toshiba, Kawasaki, Japan

[21] Appl. No.: 09/034,222

[22] Filed: Mar. 4, 1998

[30] Foreign Application Priority Data

Mar. 6, 1997 [JP] Japan .................................. 9-051517

[51] Int. Cl.[6] ...................................................... G11C 8/00
[52] U.S. Cl. ...................................... 365/236; 365/238.5
[58] Field of Search ................................. 365/236, 238.5, 365/189.07; 377/116, 117

[56] References Cited

U.S. PATENT DOCUMENTS

| | | | |
|---|---|---|---|
| 5,550,784 | 8/1996 | Takai | 365/236 |
| 5,822,270 | 10/1998 | Park | 365/236 |
| 5,831,926 | 11/1998 | Norris et al. | 365/236 |

*Primary Examiner*—Tan T. Nguyen
*Attorney, Agent, or Firm*—Banner & Witcoff, Ltd.

[57] ABSTRACT

An address counter circuit comprises a first address output circuit for outputting an input address at a first timing, an additional circuit for adding a predetermined value to the input address while the address is output from the first output circuit, a counter circuit for counting up or down the address to which the predetermined value is added by the adding circuit, and a second address output circuit for sequentially outputting addresses obtained upon count-up or count-down operation of the counter circuit after the first timing.

20 Claims, 7 Drawing Sheets

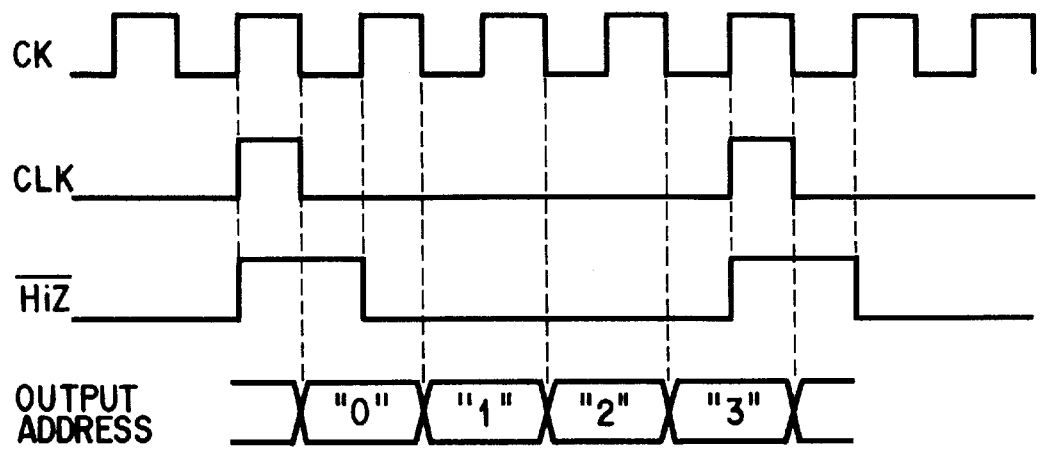
FIG. 6
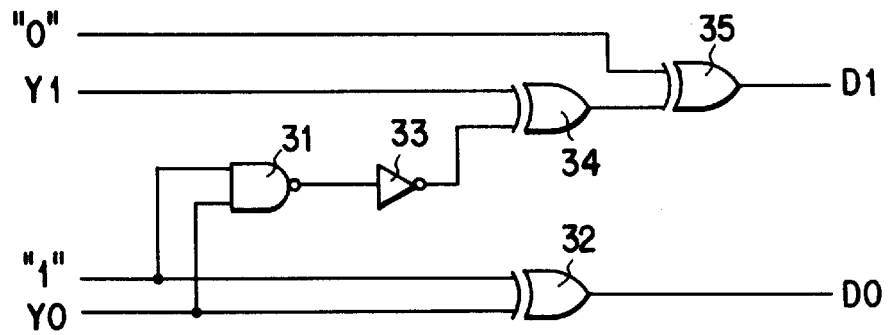
FIG. 7
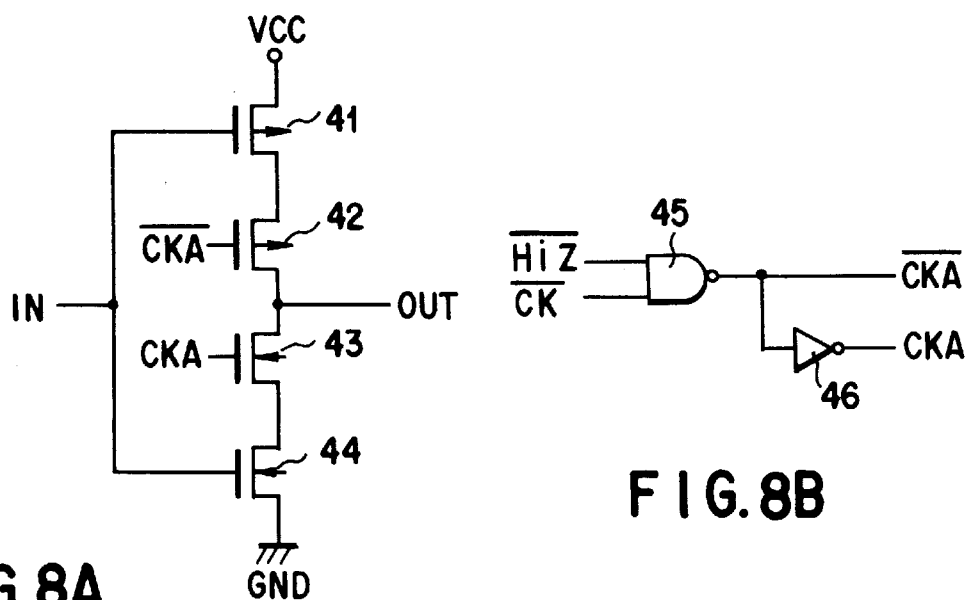
FIG. 8A
FIG. 8B

ADDRESS COUNTER CIRCUIT AND SEMICONDUCTOR MEMORY DEVICE

BACKGROUND OF THE INVENTION

The present invention relates to a semiconductor memory device and, more particularly, to an address counter circuit for automatically generating addresses inside a memory in a high-speed operation mode.

Counter circuits using typical flip-flops have become an established technology. But a counter circuit used in a PBM (Pipelined Burst Mode) must fulfill the following timing condition to ensure normal operation.

If a clock signal is input to the counter circuit to cause it to count up before a start address is determined, the circuit starts counting up from a wrong start address, resulting in an operation error.

To cause the counter circuit to properly operate, therefore, the count operation of the counter circuit must be started after a lapse of a sufficient period of time necessary for a start address to be input to the circuit.

For this purpose, the timing margin until a start address is properly received by the counter circuit must be considered, in addition to the time required to count up the start address after a clock signal is input to the counter circuit.

FIG. 1 shows a T-type flip-flop which is constituted by six NAND gates 71 to 76 and serves as the core of a 1-bit counter circuit.

This T-type flip-flop operates like other common flip-flops; the output states are inverted from Q to $\overline{Q}$ and from $\overline{Q}$ to Q every time a clock pulse CK is input.

Such a T-type flip-flop, however, does not have the function of setting the initial values of outputs Q and $\overline{Q}$, and hence cannot be used as a counter circuit. That is, this flip-flop cannot be initialized to the state of Q=H and $\overline{Q}$=L or Q=L and $\overline{Q}$=H.

To use this flip-flop as a counter circuit capable of initialization, two NAND gates 77 and 78, two n-channel MOS transistors 79 and 80, and two p-channel MOS transistors 81 and 82 must be added to the T-type flip-flop in FIG. 1, as shown in FIG. 2. The NAND gates 77 and 78 calculate the NANDs between a clear signal CLR and addresses A and $\overline{A}$. The n-channel MOS transistors 79 and 80 are gate-controlled by outputs from the NAND gates 77 and 78 to discharge the outputs Q and $\overline{Q}$ to the ground potential (L). The p-channel MOS transistors 81 and 82 are gate-controlled by outputs from the NAND gates 77 and 78. When the output Q or $\overline{Q}$ is discharged to the ground potential by using the n-channel MOS transistors 79 and 80, the p-channel MOS transistors 81 and 82 serve to connect the NAND gate 75 or 76, whose output is connected to one of the n-channel MOS transistors which is to be turned off, to a power supply Vcc to activate the gate.

The counter circuit having the arrangement shown in FIG. 2 operates as follows.

The clear signal CLR (pulse signal) is input to the circuit at a certain count start timing to receive a start address. Note that the clear signal CLR is a signal indicating the timing at which a count-up operation is started.

When the clear signal CLR is input, the addresses $\overline{A}$ and A are set to the outputs Q and $\overline{Q}$. If, for example, the clear signal CLR is input when $\overline{A}$=L and A=H, an output from the NAND gate 77 is set at H level. As a result, the n-channel MOS transistor 79 on the output Q side is turned on to set the output Q at L level. At this time, since the p-channel MOS transistor 81 is turned off, the NAND gate 75 does not operate.

An output from the NAND gate 78 is set at L level. As a result, the n-channel MOS transistor 80 on the output $\overline{Q}$ side is turned off, but the p-channel MOS transistor 82 is turned on. The NAND gate 76 is therefore activated.

In this case, since the output Q (L) is input to the NAND gate 76, the output of the NAND gate 76, i.e., the output $\overline{Q}$, is set at H level. Thereafter, every time the clock pulse CK is input, the previous states are sequentially inverted.

Recently, demands have arisen for a synchronous memory having a burst function. Conventional memories receive an address in the first cycle and read or write data corresponding to the address in the next cycle. In contrast to this, in a memory having a burst function, a so-called burst address is set. When a burst mode is set, a burst address obtained by incrementing an address received at the start of a burst period is automatically generated to continuously read or write 2- or 4-length data corresponding to the address. In this interval, no new external address is received.

FIG. 3 shows a conventional address counter circuit constituted by two counter circuits each identical to the one shown in FIG. 2.

This address counter circuit generates 2-bit addresses Q0, $\overline{Q0}$, Q1, and $\overline{Q1}$. More specifically, an input address $\overline{A0}$ at the first bit and a clear signal CLR are input to a NAND gate 77 in a first-stage counter circuit C1, and an input address A0 at the first bit and the clear signal CLR are input to a NAND gate 78.

First bits Q0 and $\overline{Q0}$ of the burst addresses are respectively output from NAND gates 75 and 76 in the first-stage counter circuit C1. An input address $\overline{A1}$ at the second bit and an inverted signal of the output of a NAND gate 73 in the first-stage counter circuit C1 are input to the NAND gate 77 in a second-stage counter circuit C2. An address A1 at the second bit and an inverted signal of the output of the NAND gate 73 in the first-stage counter circuit C1 are input to the NAND gate 78.

Second bits Q1 and $\overline{Q1}$ of the burst addresses are respectively output from the NAND gates 75 and 76 in the second-stage counter circuit C2.

Assume that in a memory required to operate at a cycle time of about 15 ns to 20 ns, about 15% of the cycle time is assigned to the address counter circuit. In this case, the address counter circuit need only operate at 2.25 ns to 3 ns. In this case, an address counter circuit like the one shown in FIG. 3 suffices.

Recently, however, demands have arisen for a fast cache memory with a cycle time of about 5 ns. In this case, the time assigned to the address counter circuit must be set within 0.75 ns.

In the conventional address counter circuit shown in FIG. 3, if the input timing of a clock pulse is set to be earlier than the proper reception timing of the start address to forcibly quicken the start of operation, counting is started from a wrong start address, resulting in an operation error. For this reason, the address counter circuit must be started after a lapse of a sufficient period of time necessary for a start address to be input to the address counter circuit. In this case, however, since an excessively long period of time is required for the address counter circuit, the time assigned to the address counter circuit exceeds a cycle time of 5 ns.

BRIEF SUMMARY OF THE INVENTION

The present invention has been made in consideration of the above situation, and has as its object to provide an address counter circuit for generating burst addresses which can attain a high operation speed and can be used in a semiconductor memory device with a short cycle time, and a semiconductor memory device using the same.

In order to achieve the above object, according to the first aspect of the present invention, there is provided an address counter circuit comprising:

a first address output circuit for outputting an input address at a first timing;

an additional circuit for adding a predetermined value to the input address while the address is output from the first output circuit;

a counter circuit for counting up or down the address to which the predetermined value is added by the additional circuit; and a second address output circuit for sequentially outputting addresses obtained upon count-up or countdown operation of the counter circuit after the first timing.

According to the second aspect of the present invention, there is provided an address counter circuit according to the first aspect, wherein the additional circuit is an adder circuit.

According to the third aspect of the present invention, there is provided an address counter circuit according to the first aspect, wherein the first address output circuit comprises a circuit for setting a high output impedance when the input address is not output.

According to the fourth aspect of the present invention, there is provided an address counter circuit according to the first aspect, wherein the second address output circuit comprises a circuit for setting a high output impedance when the addresses obtained upon count-up or count-down operation are not output.

According to the fifth aspect of the present invention, there is provided an address counter circuit according to the first aspect, wherein the additional circuit counts up or down the address to which the predetermined value is added in synchronism with a clock signal.

According to the sixth aspect of the present invention, there is provided an address counter circuit according to the first aspect, further comprising a storage circuit for storing the addresses obtained upon count-up or count-down operation of the counter circuit.

According to the seventh aspect of the present invention, there is provided an address counter circuit according to the first aspect, wherein the first address output circuit comprises a NAND circuit for receiving a control signal for controlling the first address output circuit and a clock signal, an inverter circuit for outputting an inverted output signal obtained by inverting an output signal from the NAND circuit, and a circuit for outputting the input address on the basis of the input address, the output signal from the NAND circuit, and the inverted signal.

According to the eighth aspect of the present invention, there is provided an address counter circuit according to the first aspect, wherein the second address output circuit comprises a NAND circuit for receiving a control signal for controlling the second address output circuit and a clock signal, an inverter circuit for outputting an inverted output signal obtained by inverting an output signal from the NAND circuit, and a circuit for outputting the addresses obtained upon count-up or count-down operation on the basis of the input address, the output signal from the NAND circuit, and the inverted signal.

According to the ninth aspect of the present invention, there is provided an address counter circuit comprising:

a first address output circuit for outputting an input address at a first timing;

an additional circuit for adding a predetermined value to the input address while the address is output from the first output circuit;

a plurality of additional circuit for adding different predetermined values to the address to which the predetermined value is added by the additional circuit;

a third address output circuit for sequentially outputting the addresses to which the different predetermined values are added by the plurality of additional circuit in synchronism with a clock signal; and a second address output circuit for sequentially outputting the addresses output from the third address output circuit after the first timing.

According to the 10th aspect of the present invention, there is provided an address counter circuit according to the ninth aspect, wherein the additional circuit is an adder circuit.

According to the 11th aspect of the present invention, there is provided an address counter circuit according to the ninth aspect, wherein the first address output circuit comprises a circuit for setting a high output impedance when the input address is not output.

According to the 12th aspect of the present invention, there is provided an address counter circuit according to the ninth aspect, wherein the second address output circuit comprises a circuit for setting a high output impedance when the addresses output from the third address output circuit are not output.

According to the 13th aspect of the present invention, there is provided an address counter circuit according to the ninth aspect, wherein the first address output circuit comprises a NAND circuit for receiving a control signal for controlling the first address output circuit and a clock signal, an inverter circuit for outputting an inverted output signal obtained by inverting an output signal from the NAND circuit, and a circuit for outputting the input address on the basis of the input address, the output signal from the NAND circuit, and the inverted signal.

According to the 14th aspect of the present invention, there is provided an address counter circuit according to the ninth aspect, wherein the second address output circuit comprises a NAND circuit for receiving a control signal for controlling the second address output circuit and a clock signal, an inverter circuit for outputting an inverted output signal obtained by inverting an output signal from the NAND circuit, and a circuit for outputting the addresses output from the third address output circuit on the basis of the input address, the output signal from the NAND circuit, and the inverted signal.

According to the 15th aspect of the present invention, there is provided an address counter circuit according to the ninth aspect, wherein the third address output circuit comprises a plurality of storage circuit for respectively storing the addresses to which the different predetermined values are added.

According to the 16th aspect of the present invention, there is provided an address counter circuit according to the 15th aspect, further comprising:

a fourth address output circuit for outputting an address different from the input address at the first timing; and a fifth address output circuit for sequentially outputting an address stored in one storage circuit, of the addresses stored in the plurality of storage circuit, after the first timing.

According to the 17th aspect of the present invention, there is provided a semiconductor memory device comprising:

a memory cell array having a plurality of word lines and bit lines and memory cells arranged at intersections of the word lines and the bit lines;

a word line selection circuit for selecting a word line of the memory cell array on the basis of a first address;

a first address output circuit for receiving a second address and outputting the second address at a first timing;

an additional circuit for adding a predetermined value to the second address while the second address is output from the first address output circuit;

a counter circuit for counting up or down the second address to which the predetermined value is added by the additional circuit;

a second address output circuit for sequentially outputting addresses obtained upon count-up or countdown operation of the counter circuit after the first timing; and a bit line selection circuit for selecting a bit line of the memory cell array on the basis of the address output from the second address output circuit.

According to the 18th aspect of the present invention, there is provided a semiconductor memory device comprising:

a memory cell array having a plurality of word lines and bit lines and memory cells arranged at intersections of the word lines and the bit lines;

a word line selection circuit for selecting a word line of the memory cell array on the basis of a first address;

a first address output circuit for receiving a second address and outputting the second address at a first timing;

an additional circuit for adding a predetermined value to the second address while the second address is output from the first address output circuit;

a plurality of additional circuit for respectively adding different predetermined values to the address to which the predetermined value is added by the additional circuit;

a third address output circuit for sequentially outputting the second addresses to which the different predetermined values are added by the plurality of additional circuit in synchronism with a clock signal;

a second address output circuit for sequentially outputting the addresses output from the third address output circuit after the first timing; and a bit line selection circuit for selecting a bit line of the memory cell array on the basis of the addresses output from the second address output circuit.

According to the 19th aspect of the present invention, there is provided a semiconductor memory system comprising:

a memory cell array having a plurality of word lines and bit lines and memory cells arranged at intersections of the word lines and the bit lines;

a word line selection circuit for selecting a word line of the memory cell array on the basis of a first address;

a first address output circuit for receiving a second address and outputting the second address at a first timing;

an additional circuit for adding a predetermined value to the second address while the second address is output from the first address output circuit;

a counter circuit for counting up or down the second address to which the predetermined value is added by the additional circuit;

a second address output circuit for sequentially outputting addresses obtained upon count-up or count-down operation of the counter circuit after the first timing;

a bit line selection circuit for selecting a bit line of the memory cell array on the basis of the address output from the second address output circuit;

a data bus for transferring write data and read data for a memory cell selected by the word line selection circuit and the bit line selection circuit; and a control circuit for controlling the write data and the read data for the selected memory cell through the data bus.

According to the 20th aspect of the present invention, there is provided a semiconductor memory system comprising:

a memory cell array having a plurality of word lines and bit lines and memory cells arranged at intersections of the word lines and the bit lines;

a word line selection circuit for selecting a word line of the memory cell array on the basis of a first address;

a first address output circuit for receiving a second address and outputting the second address at a first timing;

an additional circuit for adding a predetermined value to the second address while the second address is output from the first address output circuit;

a plurality of additional circuit for respectively adding different predetermined values to the second address to which the predetermined value is added by the additional circuit;

a third address output circuit for sequentially outputting the second addresses to which the different predetermined values are added by the plurality of additional circuit in synchronism with a clock signal;

a second address output circuit for sequentially outputting the second addresses output from the third address output circuit after the first timing;

a bit line selection circuit for selecting a bit line of the memory cell array on the basis of the second addresses output from the second address output circuit;

a data bus for transferring write data and read data for a memory cell selected by the word line selection circuit and the bit line selection circuit; and a control circuit for controlling the write data and the read data for the selected memory cell through the data bus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a timing chart showing the operation of the address counter circuit;

FIG. 7 is a circuit diagram showing an adder circuit;

FIGS. 8A and 8B are circuit diagrams showing a circuit arrangement corresponding to one address bit in a first output control circuit 21 in the address counter circuit;

DETAILED DESCRIPTION OF THE INVENTION

An embodiment of the present invention will be described below with reference to the accompanying drawing.

Figure 1:
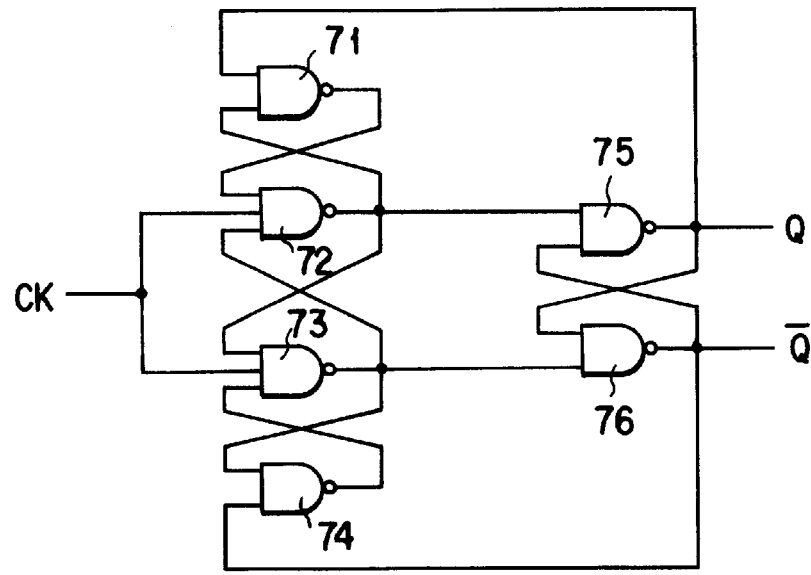
FIG. 1 is a circuit diagram showing a conventional T-type flip-flop serving as the core of a conventional 1-bit counter circuit.
Figure 2:
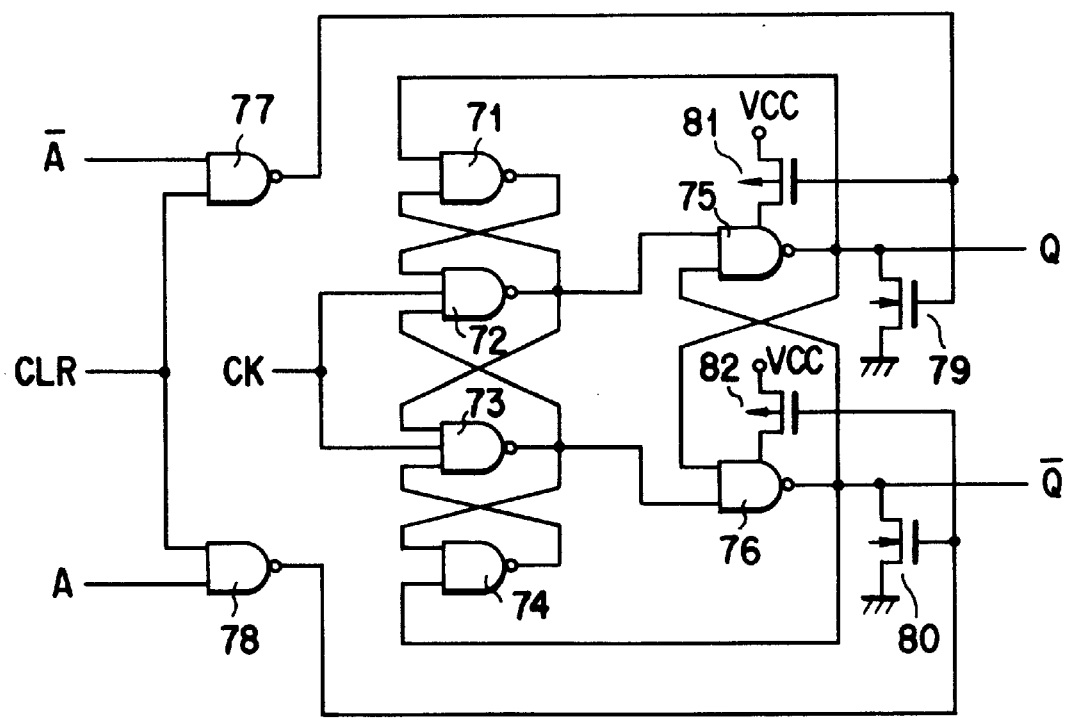
FIG. 2 is a circuit diagram showing a conventional 1-bit counter circuit which can be used as a counter circuit capable of initialization.
Figure 3:
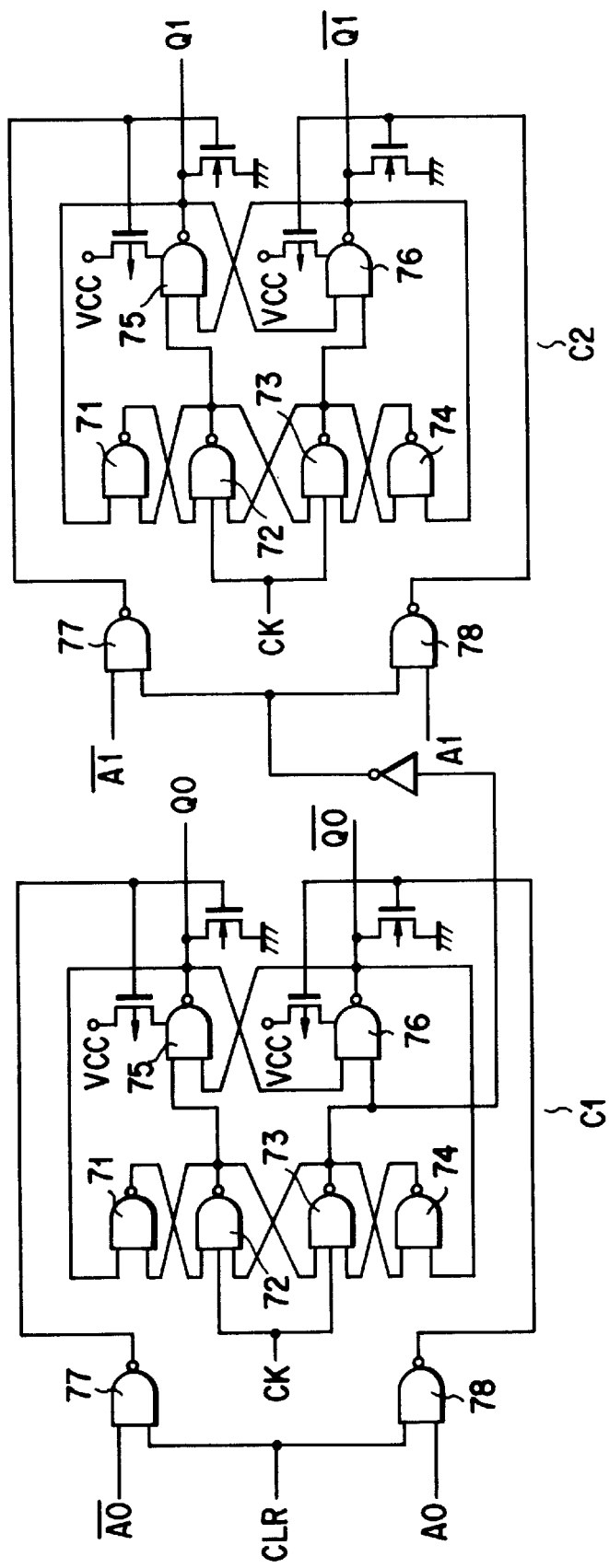
FIG. 3 is a circuit diagram showing a conventional address counter circuit constituted by two counter circuits each identical to the one shown in FIG. 2.
Figure 4:
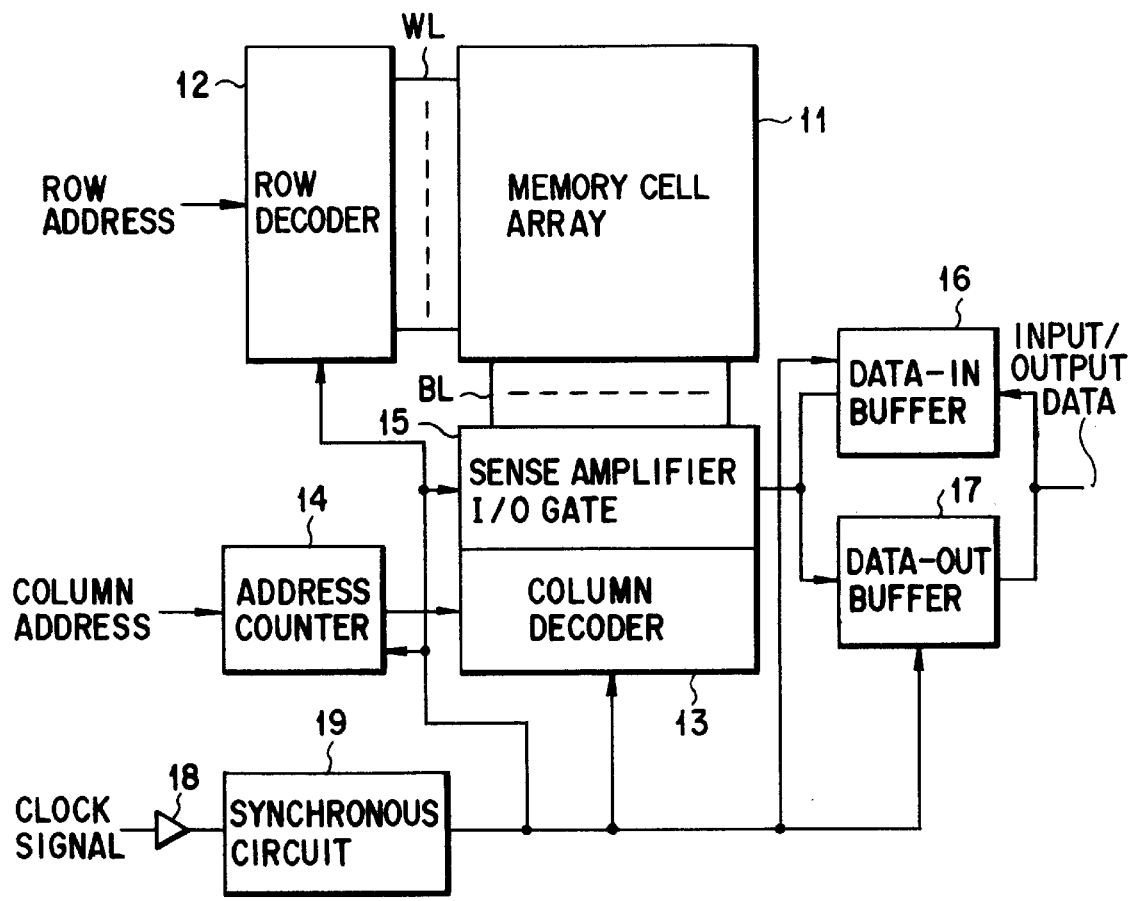
FIG. 4 is a block diagram showing the arrangement of a semiconductor memory device having an address counter circuit according to the first embodiment of the present invention.

FIG. 4 is a block diagram showing the arrangement of a semiconductor memory device having an address counter circuit according to an embodiment of the present invention.

Referring to FIG. 4, reference numeral 11 denotes a memory cell array having a plurality of word lines WL and bit lines BL and a plurality of memory cells (not shown) arranged at the intersections of the word and bit lines; 12, a row decoder for receiving a row address and selecting one word line WL in the memory cell array 11; 13, a column decoder for outputting a column selection signal for selecting one bit line BL in the memory cell array 11; and 14, an address counter circuit for receiving a column address and generating a PBM address used when the PBM is executed.

The address generated by this address counter circuit is supplied to the column decoder 13.

Reference numeral 15 denotes a sense amplifier I/O gate including an I/O gate for connecting one bit line BL in the memory cell array 11 to a data line (not shown) on the basis of the column selection signal output from the column decoder 13, and a sense amplifier for sensing the data stored in a memory cell connected to the selected bit line BL; 16, a data-in buffer for supplying write data externally input in a data write to the sense amplifier I/O gate 15; and 17, a data-out buffer for outputting read data sensed by the sense amplifier I/O gate 15 in a data read to the outside.

Reference numeral 18 denotes a clock buffer for receiving a clock signal; and 19, a synchronous circuit for receiving an output from the clock buffer 18 and generating an internal clock signal for controlling each circuit described above.

In the semiconductor memory device having the above arrangement, when a data write/read is to be performed in the normal mode, desired word and bit lines in the memory cell array 11 are selected on the basis of outputs from the row decoder 12 and the column decoder 13 which are based on an address input (row and column addresses). The memory cell at the intersection of the selected word and bit lines is selected.

In a data write, write data from the data-in buffer 16 is written in the selected memory cell. In a data read, the read data sensed by the sense amplifier in the sense amplifier I/O gate 15 is externally output through the data-out buffer 17.

In the PBM, after the first column address is received by the address counter circuit 14, the address counter circuit 14 sequentially generates internal addresses in synchronism with a clock signal. These internal addresses are supplied to the column decoder 13.

In accordance with the internal addresses, bit lines in the memory cell array 11 are continuously selected. At this time, row addresses have been input to the row decoder 12, and word lines in the memory cell array 11 are selected in accordance with the input addresses.

As a result, a high-speed data read/write in the PBM described above is realized.

Figure 5:
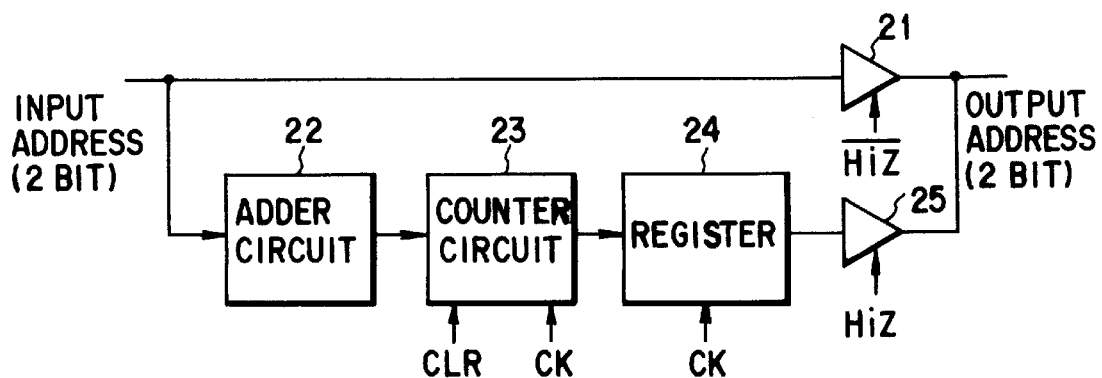
FIG. 5 is a block diagram showing the arrangement of part of an address counter circuit 14.

FIG. 5 is a block diagram showing the arrangement of part of the address counter circuit 14 used in the above semiconductor memory device.

The address counter circuit 14 has a 2-bit address configuration, i.e., a burst length of 4. FIG. 5 shows part of the address counter circuit 14.

An address input (2-bit column address) is supplied to a first output control circuit 21 and a 2-bit adder circuit 22. An output control signal Hiz has been supplied to the first output control circuit 21. When the output control signal $\overline{HiZ}$ is at H level, the first output control circuit 21 outputs the address input in synchronism with a clock signal CK. When the output control signal $\overline{HiZ}$ is at L level, the first output control circuit 21 has a high output impedance.

The adder circuit 22 adds positive integer "1" to the value represented by the address input, and outputs the resultant value.

The address output from the adder circuit 22 is supplied to a 2-bit counter circuit 23. A clear signal CLR and the clock signal CK are supplied to the counter circuit 23.

The counter circuit 23 clears the count value in accordance with the clear signal CLR, and sequentially counts up in synchronism with the clock signal CK upon reception of the address.

The address output from the counter circuit 23 is temporarily stored in a register 24 in synchronism with the clock signal CK, and is then supplied to a second output control circuit 25.

An output control signal HiZ having a phase opposite to that of the output control signal $\overline{HiZ}$ described above is supplied to the second output control circuit 25. When this output control signal HiZ is at H level, the second output control circuit 25 outputs the address from the register 24 in synchronism with the clock signal CK. When the output control signal HiZ is at L level, the second output control circuit 25 has a high output impedance.

The operation of the address counter circuit having the above arrangement will be described next with reference to the timing chart of FIG. 6.

First of all, the output control signal $\overline{\text{HiZ}}$ is set at H level at the timing of the first clock signal CK after an address is input. The clear signal CLR is set at L level in synchronism with the clock signal CK at this time.

The input address (address output "0" in FIG. 6) is output from the first output control circuit 21 during the H-level period of the output control signal $\overline{\text{HiZ}}$ in synchronism with the clock signal CK. At this time, since the output of the second output control circuit 25 has a high output impedance because the output control signal HiZ is at L level. The counter circuit 23 is cleared while the clear signal CLR is at L level.

When the address is input, the adder circuit 22 adds positive integer "1" to the value expressed by the address input. The address calculated by the adder circuit 22 is set in the counter circuit 23 after the clear signal CLR changes from L level to H level.

The output control signal $\overline{\text{HiZ}}$ is set at L level at the timing of the next clock signal CK. As a result, the first output control circuit 21 which has been active now has a high output impedance.

The address output still remains "0". At this time, when the clock signal CK is input, the counter circuit 23 counts up the initially set address by one.

This address is stored in the register 24 in synchronism with the end edge of the clock signal CK. Since the signal $\overline{\text{HiZ}}$ has been set at L level (the signal HiZ has been set at H level) at this time, the incremented address is output from the second output control circuit 25 (address output "1" in FIG. 6).

Since the signal $\overline{\text{HiZ}}$ is at L level at this time, the first output control circuit 21 has a high output impedance.

Subsequently, as the clock signals CK are sequentially input, the counter circuit 23 sequentially counts up with respect to the previous address. Each address is stored in the register 24 in synchronism with the end edge of the clock signal CK.

The addresses obtained by sequentially incrementing the previous address one by one are output from the second output control circuit 25 (address outputs "2" and "3" in FIG. 6).

As described above, in the address counter circuit shown in FIG. 5, the first input address is output through the first output control circuit 21, and the address obtained by incrementing the first input address by one using the adder circuit 22 is set in the counter circuit 23 while the first address is output.

After this, the counter circuit 23 counts up to sequentially output the resultant addresses through the second output control circuit 25. With this operation, the first input address (start address) can be immediately output without being set in the counter circuit as in the prior art. That is, there is no need to wait until the start address is set in the counter circuit, and hence a burst address can be generated at high speed.

In the semiconductor memory device in FIG. 4, which uses an address counter circuit like the one shown in FIG. 5, even if, for example, the cycle time is as short as 5 ns, and the time assigned to the address counter circuit is as short as 0.75 ns, the address counter circuit operates well without any operation error.

FIG. 7 shows the detailed circuit arrangement of the adder circuit 22 in the address counter circuit in FIG. 5. This adder circuit is known well as a 2-bit adder circuit without any carry, which adds column address inputs Y1 and Y0 and positive integer "1" ("01" in binary notation).

"1" which is the lower bit signal of positive integer "1" ("01" in binary notation) and the lower column address input Y0 are input to a NAND gate 31 and an exclusive-OR gate (to be referred to as an EXOR gate) 32.

An output from the NAND gate 31 is supplied to one input terminal of an EXOR gate 34 through an inverter 33. The upper column address input Y1 is supplied to the other input terminal of the EXOR gate 34.

In addition, "0" which is the upper bit signal of positive integer "1" and an output from the EXOR gate 34 are supplied to an EXOR gate 35. Outputs from the EXOR gates 35 and 32 become addresses D1 and D0 obtained by adding positive integer "1" to the column address inputs Y1 and Y0.

If, for example, the column address inputs Y1 and Y0 are both "0", the address D0 output from the EXOR gate 32 becomes "1". In addition, outputs from the NAND gate 31, the inverter 33, and the EXOR gate 34 become "1", "0", and "0", respectively. An output from the EXOR gate 35, to which the output from the EXOR gate 34 and "0" which is the upper bit signal of positive integer "1" are supplied, becomes "0".

That is, when the column address inputs Y1 and Y0 are both "0", the address outputs D1 and D0 become "0" and "1", which are equal to the values obtained by adding positive integer "1" to the column address inputs Y1 and Y0.

FIGS. 8A and 8B show a detailed circuit arrangement corresponding to one address bit in the first output control circuit 21 in the address counter circuit shown in FIG. 5.

As shown in FIG. 8A, this output control circuit includes two p-channel MOS transistors 41 and 42 and two n-channel MOS transistors 43 and 44 having source/drain paths connected in series between a power supply Vcc and a ground potential GND.

A 1-bit address (IN) is supplied to the gate of one p-channel MOS transistor 41 and the gate of one n-channel MOS transistor 44. A clock signal $\overline{\text{CKA}}$ is supplied to the gate of the other p-channel MOS transistor 42, and a clock signal CKA having a phase opposite to that of the clock signal $\overline{\text{CKA}}$ is supplied to the gate of the other n-channel MOS transistor 43.

FIG. 8B shows an example of a clock circuit for generating the complementary clock signals CKA and $\overline{\text{CKA}}$ used in the circuit in FIG. 8A from the output control signal $\overline{\text{HiZ}}$ and the clock signal $\overline{\text{CK}}$.

The clock signal $\overline{\text{CKA}}$ is obtained as an output from a NAND gate 45, to which the signal $\overline{\text{HiZ}}$ and the clock signal $\overline{\text{CK}}$ are supplied. The clock signal CKA is obtained as an output from an inverter 46 for inverting the output from the NAND gate 45.

In the output control circuit having the above arrangement, when the output control signal $\overline{\text{HiZ}}$ is at H level and the clock signal $\overline{\text{CK}}$ is at H level (the clock signal CK is at L level), the clock signal $\overline{\text{CKA}}$ is at L level and the clock signal CKA is at H level.

At this time, both the p-channel MOS transistor 42 and the n-channel MOS transistor 43 in FIG. 8A, to the gates of which the clock signals $\overline{\text{CKA}}$ and CKA are input, are turned on to be set i n the active state. As a consequence, the input IN is inverted to obtain an output OUT.

When the output control signal $\overline{\text{HiZ}}$ is set at L level, the clock signal $\overline{\text{CKA}}$ output from the NAND gate 45 is set at H level, and the clock signal CKA output from the inverter 46 is set at L level, regardless of the level of the clock signal $\overline{\text{CK}}$. Hence, both the p-channel MOS transistor 42 and the n-channel MOS transistor 43 in FIG. 8A are turned off, and the output OUT has a high impedance.

In this case, the input/output signals to/from the first output control circuit 21 have opposite logic levels. If, however, the two logic levels must be matched with each other, an inverter or the like may be used to further invert the signal OUT.

The second output control circuit 25 in the address counter circuit has the same arrangement as that of the first output control circuit 21 except that the signal HiZ is supplied in place of the signal $\overline{\text{HiZ}}$.

Figure 9:
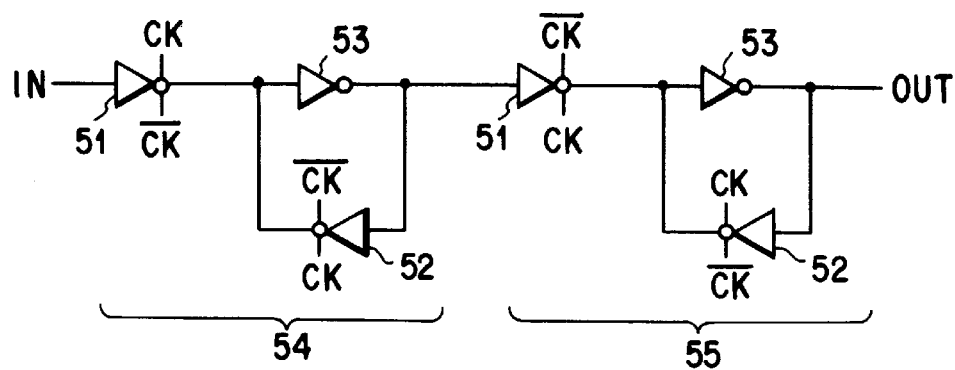
FIG. 9 is a circuit diagram showing a circuit arrangement corresponding to one bit in a register in the address counter circuit.

FIG. 9 shows a de tail ed circuit arrangement corresponding to a 1-bit portion of the register 24 in the address counter circuit shown in FIG. 5.

This register is constituted by a master latch circuit 54 and a slave latch circuit 55 which are cascaded. Each circuit has two clocked inverters 51 and 52 and one inverter 53.

One bit of the 2-bit address output from the counter circuit 23 (shown in FIG. 4) is input as the input IN to one clocked inverter 51 in the master latch circuit 54.

This clocked inverter 51 operates to invert the input IN when the clock signal CK is at L level and clock signal $\overline{\text{CK}}$ is at H level. An output from the clocked inverter 51 is input to the inverter 53.

The other clocked inverter 52 is antiparallelly connected with the inverter 53 between its input and output terminals. This clocked inverter 52 operates when the clock signal $\overline{\text{CK}}$ is at L level and the clock signal CK is at H level.

One clocked inverter 51 in the slave latch circuit 55 operates to invert an output from the master latch circuit 54 when the clock signal $\overline{\text{CK}}$ is at L level and the clock signal CK is at H level.

An output from the clocked inverter 51 is input to the inverter 53. The other clocked inverter 52 is antiparallelly connected with the inverter 53 between its input and output terminals. This clocked inverter 52 operates when the clock signal CK is at L level and the clock signal $\overline{\text{CK}}$ is at H level.

In the above embodiment, the adder circuit 22 in FIG. 5 adds "1" to the start address, and the counter circuit 23 sequentially counts up in synchronism with the clock signal CK upon reception of the output address from the adder circuit 22. However, a subtracter for subtracting "1" from the start address may be used in place of the adder circuit 22, and the counter circuit 23 may sequentially count down in synchronism with the clock signal CK upon reception of the output address from the subtracter. In this arrangement, the start address is sequentially decremented one by one to obtain burst addresses.

Figure 10:
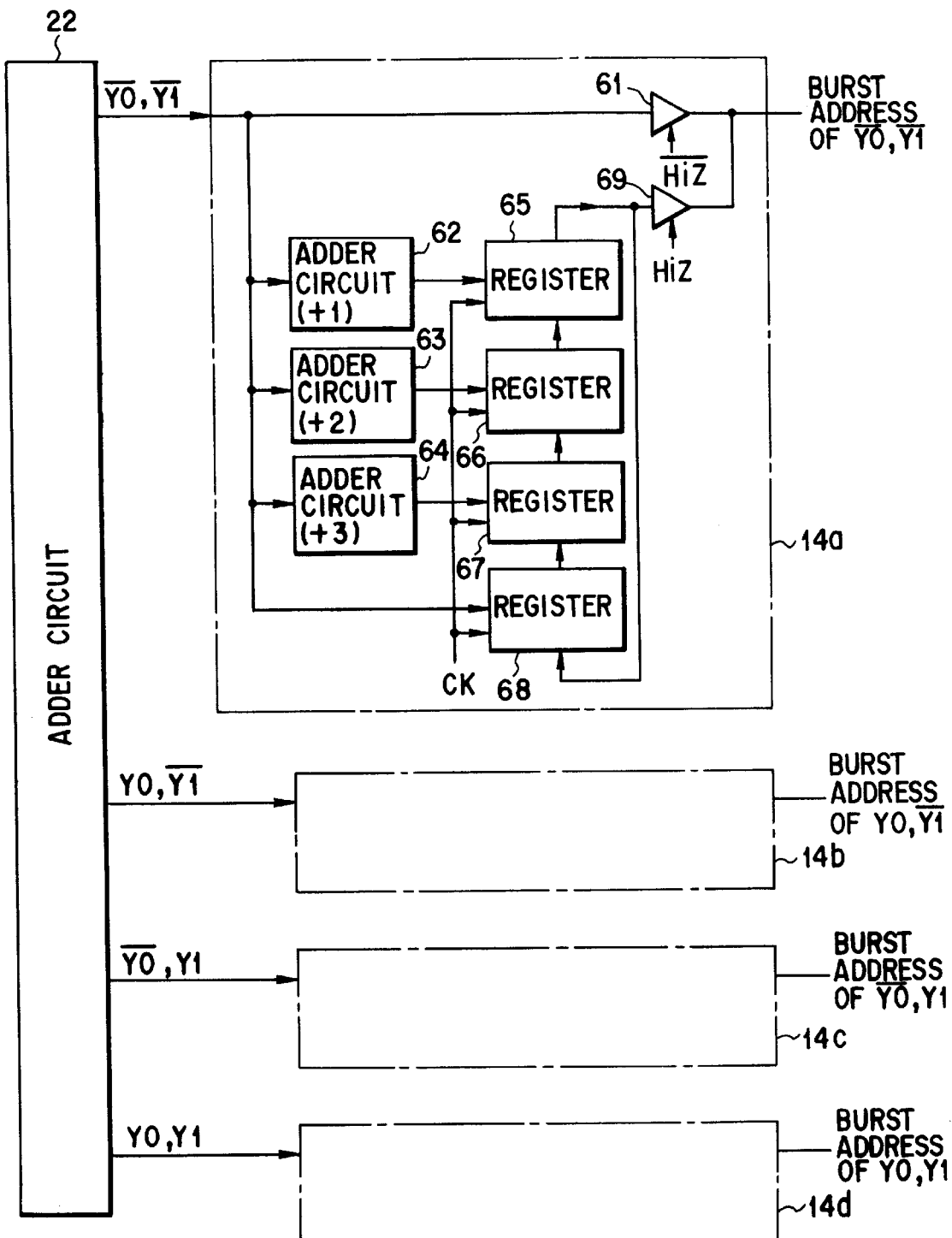
FIG. 10 is a block diagram showing the first modification of the address counter circuit.

FIG. 10 is a block diagram showing the overall arrangement of an address counter circuit 14 having a burst length of 4 and used in the semiconductor memory device in FIG. 4.

The adder circuit 22 generates four 2-bit address inputs from one address input (2 bits), and respectively outputs the four address inputs $\overline{\text{Y0}}/\overline{\text{Y1}}$, Y0/$\overline{\text{Y1}}$, $\overline{\text{Y0}}$/Y1, and Y0/Y1 to counter circuits 14a to 14d.

In this case, the counter circuits 14a to 14d are respectively provided for the 2-bit inputs constituted by the combinations of the address inputs $\overline{\text{Y0}}/\overline{\text{Y1}}$, Y0/$\overline{\text{Y1}}$, $\overline{\text{Y0}}$/Y1, and Y0/Y1. Note that, the adder circuit 22 may be a conventional adder circuit. In this case, a logic circuit for generating the address inputs $\overline{\text{Y0}}/\overline{\text{Y1}}$, Y0/$\overline{\text{Y1}}$, $\overline{\text{Y0}}$/Y1, and Y0/Y1 is provided between the adder circuit 22 and counter 14.

All the counter circuits 14a to 14d have the same arrangement. As indicated by the illustration of the counter circuit 14a, each address input is parallelly supplied to a first output control circuit 61 and first to third adder circuits 62 to 64.

The output control signal $\overline{\text{HiZ}}$ is supplied to the first output control circuit 61. When this signal $\overline{\text{HiZ}}$ is set at H level, the first output control circuit 61 outputs the address input in synchronism with the clock signal CK. When the signal $\overline{\text{HiZ}}$ is set at L level, the first output control circuit 61 has a high output impedance.

The first to third adder circuits 62 to 64 respectively add positive integers "1", "2", and "3" to the value represented by the address input, and output the resultant values.

The outputs from the first to third adder circuits 62 to 64 and the address input are parallelly supplied to registers 65 to 68. These four registers 65 to 68 are cascaded such that an output from each register is supplied to a preceding register. In addition, an output from the first register 65 is fed back to the last register 68. That is, these registers are connected in the form of a ring as a whole.

These registers 65 to 68 sequentially shift the stored addresses toward the preceding stage in synchronism with the clock signal CK. In addition, the registers 65 to 68 store the 2-bit burst addresses output from the adder circuits 22 and 62 to 64.

The output from the first register is also supplied to a second output control circuit 69. The output control signal HiZ is supplied to the second output control circuit 69. When this signal HiZ is at H level, the second output control circuit 69 outputs the address from the register 65 in synchronism with the clock signal CK. When the signal HiZ is at L level, the second output control circuit 69 has a high output impedance.

For example, each of the first and second output control circuits 61 and 69 has the same arrangement as that shown in FIGS. 8A and 8B, and each of the four registers 65 to 68 has the same arrangement as that shown in FIG. 9.

The operation of the address counter circuit having the arrangement shown in FIG. 10 will be described next.

First of all, after an address is input, the signal $\overline{\text{HiZ}}$ is set at H level, and the input address is output from the first output control circuit 61, as in the above case. At this time, since the signal HiZ is at L level, second output control circuit 69 has a high output impedance.

When the address input is input, the first to third adder circuits 62 to 64 respectively add positive integers "1", "2", and "3" to the value represented by the address input.

The resultant addresses obtained by these adder circuits 62 to 64 and the address input (start address) are stored in the registers 65 to 68.

At the next timing, the signal $\overline{\text{HiZ}}$ is set at L level, and the signal HiZ is set at H level. As a result, the first output control circuit 61 which been active now has a high output impedance, and the second output control circuit 69 is activated instead of the first output control circuit 61.

Subsequently, every time the clock signal CK is input to the registers 65 to 68, the addresses stored in the registers 65 to 68 are sequentially shifted toward the front stage and supplied to the second output control circuit 69.

With this operation, the addresses obtained by adding +1, +2, and +3 to the start address are sequentially output from the second output control circuit 69.

In the address counter circuit shown in FIG. 10, when the clock signal CK is kept supplied, the four consecutive addresses stored in the registers 65 to 68 in advance are repeatedly output a plurality of number of times. By changing only the row address, therefore, burst addresses can be internally generated on the basis of the start address received at the start of a burst period.

The address counter circuit shown in FIG. 10 may also operate as follows. The first input address is output through the first output control circuit 61. While this first address is output, the adder circuits 62 to 64 add +1 to +3 to the first input address, and the resultant addresses are stored in the registers 65 to 67. Thereafter, the values in the registers 65 to 68 are shifted to sequentially output the addresses, obtained by incrementing the start address one by one, through the second output control circuit 69.

With this operation, the first input address (start address) can be immediately output without being set in the counter circuit as in the prior art, and hence there is no need to wait until the start address is set in the counter circuit. Burst addresses can therefore be generated at high speed.

When an address counter circuit like the one shown in FIG. 10 is used in the semiconductor memory device in FIG. 4, the address counter circuit operates well without any operation error even if the cycle time is as short as 5 ns and the time assigned to the address counter circuit is as short as 0.75 ns.

In the address counter circuit shown in FIG. 10, the first to third adder circuits 62 to 64 respectively add 1, 2, and 3 to the start address. In place of the adder circuits, however, subtracters for respectively subtracting 1, 2, and 3 from the start address may be used. In this case, burst addresses are obtained by decrementing the start address one by one.

Figure 11:
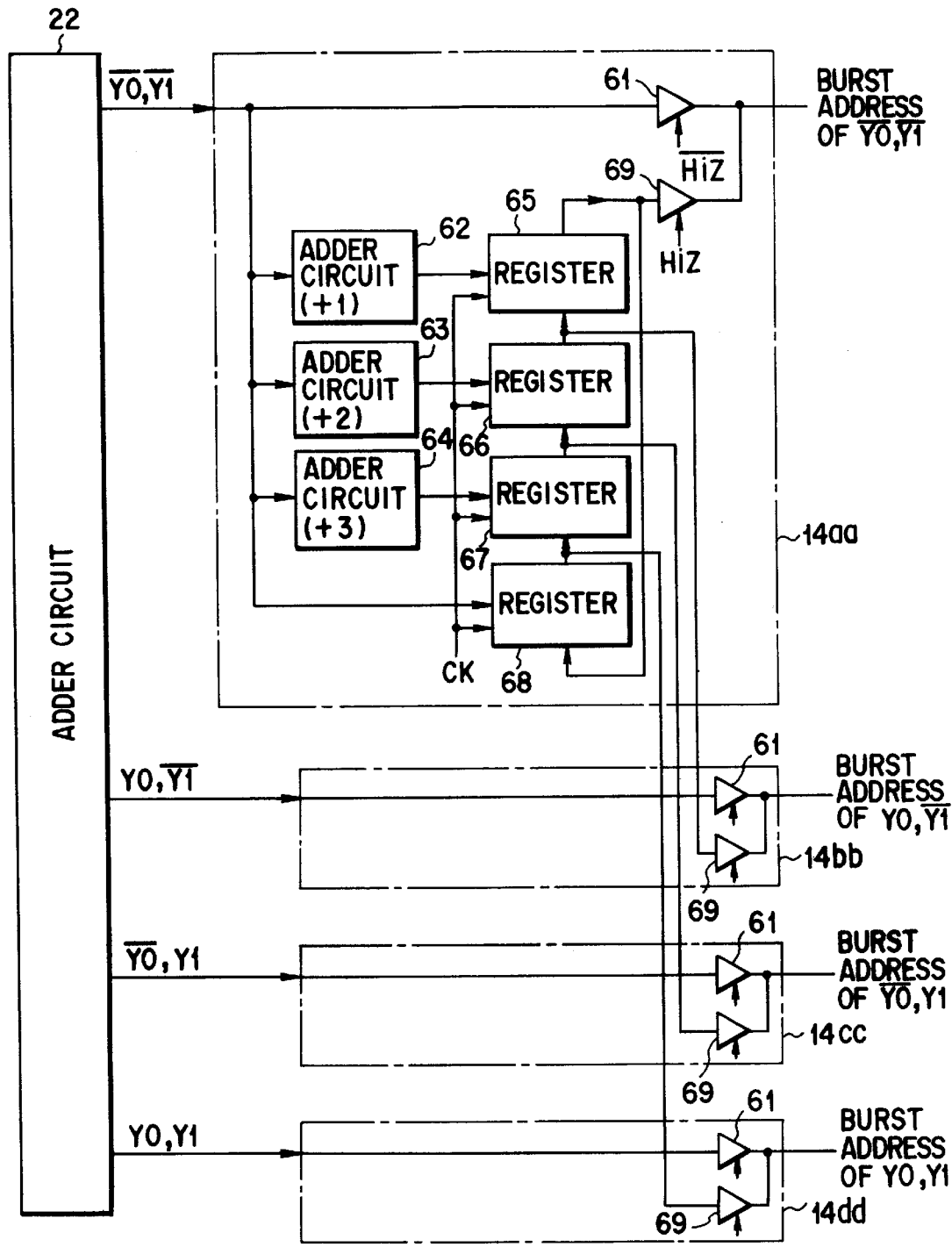
FIG. 11 is a block diagram showing the second modification of the address counter circuit.

FIG. 11 is a block diagram showing another example of the address counter circuit 14 having a burst length of 4 and used in the semiconductor memory device in FIG. 4.

In this case, a counter circuit 14aa to which the address input $\overline{Y0}/\overline{Y1}$ is supplied has the same arrangement as that of the counter circuit 14a in FIG. 10. Each of counter circuits 14bb to 14dd to which the remaining address inputs Y0/$\overline{Y1}$, $\overline{Y0}$/Y1, and Y0/Y1 are supplied is made up of only the first and second output control circuits 61 and 69.

Address inputs are respectively supplied to the first output control circuits 61 in the counter circuits 14bb to 14dd, and outputs from the registers 66 to 68 in the counter circuit 14aa are respectively supplied to the second output control circuits 69.

According to this arrangement, it suffices if the adder circuits 62 to 64 and the registers 66 to 68, each having a relatively complicated arrangement, are arranged in one counter circuit 14aa. These components need not be arranged in the remaining counter circuits 14bb to 14dd. A simple arrangement can therefore be realized.

Figure 12:
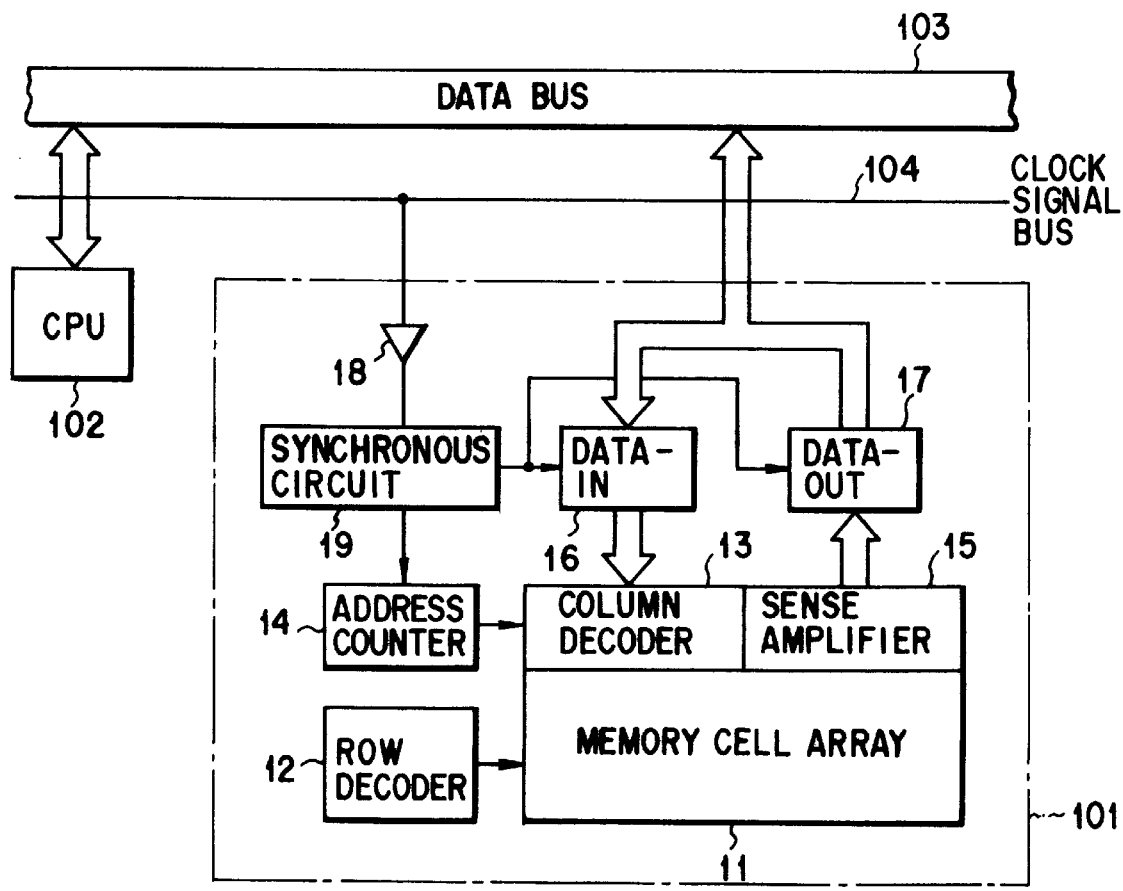
FIG. 12 is a block diagram showing a semiconductor memory system according to the embodiment of the present invention.

FIG. 12 is a block diagram showing the arrangement of a semiconductor memory system using the semiconductor memory device shown in FIG. 4.

Referring to FIG. 12, reference numeral 101 denotes a semiconductor memory device having an address counter circuit 14 like the one shown in FIG. 10 or 11; 102, a CPU (Central Processing Unit); 103, a data bus for connecting the semiconductor memory device 101 to the CPU 102; and 104, a clock signal bus for connecting the semiconductor memory device 101 to the CPU 102.

The CPU 102 generates the above clock signal and outputs it to the clock signal bus 104. The CPU 102 also generates write data and outputs it to the data bus 103 in a data write.

In a data read, the data read out from the semiconductor memory device 101 is supplied to the CPU 102 through the data bus 103.

As has been described above, according to the present invention, an address counter circuit for generating burst addresses which can attain a high operation speed and can be used in a semiconductor memory device with a short cycle time, and a semiconductor memory device using the same can be provided.

According to such a semiconductor memory system, therefore, the address (start address) input to a counter circuit can be immediately output without being set therein as in the prior art. For this reason, there is no need to wait until the start address is set in the counter circuit, and burst addresses can be generated at high speed. Consequently, a high-speed semiconductor memory system can be realized.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. An address counter circuit comprising:

a first address output circuit for outputting an input address at a first timing;

an additional circuit for adding a predetermined value to the input address while the address is output from said first output circuit;

a counter circuit for counting up or down the address to which the predetermined value is added by said additional circuit; and a second address output circuit for sequentially outputting addresses obtained upon count-up or count-down operation of said counter circuit after the first timing.

2. A circuit according to claim 1, wherein said additional circuit is an adder circuit.

3. A circuit according to claim 1, wherein said first address output circuit comprises a circuit for setting a high output impedance when the input address is not output.

4. A circuit according to claim 1, wherein said second address output circuit comprises a circuit for setting a high output impedance when the addresses obtained upon count-up or count-down operation are not output.

5. A circuit according to claim 1, wherein said additional circuit counts up or down the address to which the predetermined value is added in synchronism with a clock signal.

6. A circuit according to claim 1, further comprising a storage circuit for storing the addresses obtained upon count-up or count-down operation of said counter circuit.

7. A circuit according to claim 1, wherein said first address output circuit comprises a NAND circuit for receiving a control signal for controlling said first address output circuit and a clock signal, an inverter circuit for outputting an inverted output signal obtained by inverting an output signal from said NAND circuit, and a circuit for outputting the input address on the basis of the input address, the output signal from said NAND circuit, and the inverted signal.

8. A circuit according to claim 1, wherein said second address output circuit comprises a NAND circuit for receiving a control signal for controlling said second address output circuit and a clock signal, an inverter circuit for outputting an inverted output signal obtained by inverting an output signal from said NAND circuit, and a circuit for outputting the addresses obtained upon count-up or count-down operation on the basis of the input address, the output signal from said NAND circuit, and the inverted signal.

9. An address counter circuit comprising:
a first address output circuit for outputting an input address at a first timing;
an additional circuit for adding a predetermined value to the input address while the address is output from said first output circuit;
a plurality of additional circuit for adding different predetermined values to the address to which the predetermined value is added by said additional circuit;
a third address output circuit for sequentially outputting the addresses to which the different predetermined values are added by said plurality of additional circuit in synchronism with a clock signal; and
a second address output circuit for sequentially outputting the addresses output from said third address output circuit after the first timing.

10. A circuit according to claim 9, wherein said additional circuit is an adder circuit.

11. A circuit according to claim 9, wherein said first address output circuit comprises a circuit for setting a high output impedance when the input address is not output.

12. A circuit according to claim 9, wherein said second address output circuit comprises a circuit for setting a high output impedance when the addresses output from said third address output circuit are not output.

13. A circuit according to claim 9, wherein said first address output circuit comprises
a NAND circuit for receiving a control signal for controlling said first address output circuit and a clock signal,
an inverter circuit for outputting an inverted output signal obtained by inverting an output signal from said NAND circuit, and
a circuit for outputting the input address on the basis of the input address, the output signal from said NAND circuit, and the inverted signal.

14. A circuit according to claim 9, wherein said second address output circuit comprises
a NAND circuit for receiving a control signal for controlling said second address output circuit and a clock signal,
an inverter circuit for outputting an inverted output signal obtained by inverting an output signal from said NAND circuit, and
a circuit for outputting the addresses output from said third address output circuit on the basis of the input address, the output signal from said NAND circuit, and the inverted signal.

15. A circuit according to claim 9, wherein said third address output circuit comprises a plurality of storage circuit for respectively storing the addresses to which the different predetermined values are added.

16. A circuit according to claim 15, further comprising:
a fourth address output circuit for outputting an address different from the input address at the first timing; and
a fifth address output circuit for sequentially outputting an address stored in one storage circuit, of the addresses stored in said plurality of storage circuit, after the first timing.

17. A semiconductor memory device comprising:
a memory cell array having a plurality of word lines and bit lines and memory cells arranged at intersections of the word lines and the bit lines;
a word line selection circuit for selecting a word line of said memory cell array on the basis of a first address;
a first address output circuit for receiving a second address and outputting the second address at a first timing;
an additional circuit for adding a predetermined value to the second address while the second address is output from said first address output circuit;
a counter circuit for counting up or down the second address to which the predetermined value is added by said additional circuit;
a second address output circuit for sequentially outputting addresses obtained upon count-up or count-down operation of said counter circuit after the first timing; and
a bit line selection circuit for selecting a bit line of said memory cell array on the basis of the address output from said second address output circuit.

18. A semiconductor memory device comprising:
a memory cell array having a plurality of word lines and bit lines and memory cells arranged at intersections of the word lines and the bit lines;
a word line selection circuit for selecting a word line of said memory cell array on the basis of a first address;
a first address output circuit for receiving a second address and outputting the second address at a first timing;
an additional circuit for adding a predetermined value to the second address while the second address is output from said first address output circuit;
a plurality of additional circuit for respectively adding different predetermined values to the second address to which the predetermined value is added by said additional circuit;
a third address output circuit for sequentially outputting the addresses to which the different predetermined values are added by said plurality of additional circuit in synchronism with a clock signal;
a second address output circuit for sequentially outputting the addresses output from said third address output circuit after the first timing; and
a bit line selection circuit for selecting a bit line of said memory cell array on the basis of the addresses output from said second address output circuit.

19. A semiconductor memory system comprising:
a memory cell array having a plurality of word lines and bit lines and memory cells arranged at intersections of the word lines and the bit lines;
a word line selection circuit for selecting a word line of said memory cell array on the basis of a first address;
a first address output circuit for receiving a second address and outputting the second address at a first timing;
an additional circuit for adding a predetermined value to the input address while the address is output from said first address output circuit;
a counter circuit for counting up or down the address to which the predetermined value is added by said additional circuit;
a second address output circuit for sequentially outputting addresses obtained upon count-up or countdown operation of said counter circuit after the first timing;
a bit line selection circuit for selecting a bit line of said memory cell array on the basis of the address output from said second address output circuit;

a data bus for transferring write data and read data for a memory cell selected by said word line selection circuit and said bit line selection circuit; and a control circuit for controlling the write data and the read data for the selected memory cell through said data bus.

20. A semiconductor memory system comprising:

a memory cell array having a plurality of word lines and bit lines and memory cells arranged at intersections of the word lines and the bit lines;

a word line selection circuit for selecting a word line of said memory cell array on the basis of a first address;

a first address output circuit for receiving a second address and outputting the second address at a first timing;

an additional circuit for adding a predetermined value to the second address while the second address is output from said first address output circuit;

a plurality of additional circuit for respectively adding different predetermined values to the second address to which the predetermined value is added by said additional circuit;

a third address output circuit for sequentially outputting the second addresses to which the different predetermined values are added by said plurality of additional circuit in synchronism with a clock signal;

a second address output circuit for sequentially outputting the second addresses output from said third address output circuit after the first timing;

a bit line selection circuit for selecting a bit line of said memory cell array on the basis of the second addresses output from said second address output circuit;

a data bus for transferring write data and read data for a memory cell selected by said word line selection circuit and said bit line selection circuit; and a control circuit for controlling the write data and the read data for the selected memory cell through said data bus.

* * * * *